(12) United States Patent
Lagally et al.

(10) Patent No.: US 7,777,290 B2
(45) Date of Patent: Aug. 17, 2010

(54) PIN DIODES FOR PHOTODETECTION AND HIGH-SPEED, HIGH-RESOLUTION IMAGE SENSING

(75) Inventors: Max G. Lagally, Madison, WI (US); Zhenqiang Ma, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/452,135

(22) Filed: Jun. 13, 2006

(65) Prior Publication Data
US 2007/0284688 A1    Dec. 13, 2007

(51) Int. Cl.
*H01L 29/861*    (2006.01)
(52) U.S. Cl. ............... 257/458; 257/656; 257/E29.336; 257/E31.061
(58) Field of Classification Search ................. 257/458, 257/E29.336, 656, E31.061
See application file for complete search history.

(56) References Cited

U.S. PATENT DOCUMENTS

| | | | |
|---|---|---|---|
| 4,792,859 A * | 12/1988 | Wicker et al. ............... 358/473 |
| 4,846,931 A | 7/1989 | Gmitter et al. |
| 4,883,561 A | 11/1989 | Gmitter et al. |
| 4,940,901 A * | 7/1990 | Henry et al. ........... 250/370.09 |
| 5,051,803 A | 9/1991 | Kitamura et al. |
| 5,073,230 A | 12/1991 | Maracas et al. |
| 5,210,766 A * | 5/1993 | Winer et al. .................. 372/40 |
| 5,344,517 A | 9/1994 | Houlding |
| 5,364,468 A * | 11/1994 | Cho ........................... 148/33.3 |
| 5,422,305 A * | 6/1995 | Seabaugh et al. ........... 438/480 |
| 5,461,243 A | 10/1995 | Ek et al. |
| 5,465,009 A | 11/1995 | Drabik et al. |
| 5,466,949 A * | 11/1995 | Okuno ........................ 257/25 |
| 5,528,397 A | 6/1996 | Zavracky et al. |
| 5,616,515 A * | 4/1997 | Okuno ....................... 438/478 |
| 5,723,872 A * | 3/1998 | Seabaugh et al. ............. 257/25 |
| 5,759,898 A | 6/1998 | Ek et al. |
| 5,796,119 A * | 8/1998 | Seabaugh ..................... 257/25 |
| 6,018,187 A | 1/2000 | Theil et al. |
| 6,059,895 A | 5/2000 | Chu et al. |
| 6,157,047 A * | 12/2000 | Fujita et al. ................... 257/51 |
| 6,214,733 B1 | 4/2001 | Sickmiller |
| 6,242,762 B1 | 6/2001 | Brown et al. |
| 6,410,371 B1 | 6/2002 | Yu et al. |

(Continued)

FOREIGN PATENT DOCUMENTS

WO    WO 2005/122285    12/2005

OTHER PUBLICATIONS

U.S. Appl. No. 60/577,077, filed Feb. 23, 2006, Rogers et al.

(Continued)

*Primary Examiner*—Bradley K Smith
*Assistant Examiner*—Alexander Belousov
(74) *Attorney, Agent, or Firm*—Bell & Manning, LLC

(57) ABSTRACT

The present invention provides high-speed, high-efficiency PIN diodes for use in photodetector and CMOS imagers. The PIN diodes include a layer of intrinsic semiconducting material, such as intrinsic Ge or intrinsic GeSi, disposed between two tunneling barrier layers of silicon oxide. The two tunneling barrier layers are themselves disposed between a layer of n-type silicon and a layer of p-type silicon.

38 Claims, 2 Drawing Sheets

U.S. PATENT DOCUMENTS

| | | | |
|---|---|---|---|
| 6,534,841 B1 * | 3/2003 | Van Brocklin et al. | 257/530 |
| 6,573,126 B2 | 6/2003 | Cheng et al. | |
| 6,602,613 B1 | 8/2003 | Fitzgerald | |
| 6,603,156 B2 | 8/2003 | Rim | |
| 6,703,144 B2 | 3/2004 | Fitzgerald | |
| 6,713,326 B2 | 3/2004 | Cheng et al. | |
| 6,774,448 B1 * | 8/2004 | Lindemann et al. | 257/443 |
| 6,791,152 B2 * | 9/2004 | Hwang et al. | 257/458 |
| 6,809,358 B2 | 10/2004 | Hsieh et al. | |
| 6,812,495 B2 | 11/2004 | Wada et al. | |
| 6,831,263 B2 | 12/2004 | Skurnik et al. | |
| 6,897,166 B2 * | 5/2005 | Sotani et al. | 438/795 |
| 7,227,174 B2 * | 6/2007 | Mears et al. | 257/15 |
| 2002/0096717 A1 | 7/2002 | Chu et al. | |
| 2002/0168864 A1 | 11/2002 | Cheng et al. | |
| 2003/0124815 A1 | 7/2003 | Henley et al. | |
| 2003/0168659 A1 | 9/2003 | Lal et al. | |
| 2004/0253792 A1 | 12/2004 | Cohen et al. | |
| 2004/0262595 A1 * | 12/2004 | Mears et al. | 257/15 |
| 2005/0167649 A1 * | 8/2005 | Mears et al. | 257/15 |
| 2005/0184354 A1 | 8/2005 | Chu et al. | |
| 2005/0233493 A1 | 10/2005 | Augusto | |
| 2006/0038182 A1 | 2/2006 | Rogers et al. | |
| 2006/0134893 A1 | 6/2006 | Savage et al. | |

OTHER PUBLICATIONS

U.S. Appl. No. 60/601,061, filed Feb. 23, 2006, Rogers et al.
U.S. Appl. No. 60/650,305, filed Feb. 23, 2006, Rogers et al.
U.S. Appl. No. 60/663,391, filed Feb. 23, 2006, Rogers et al.
U.S. Appl. No. 60/677,617, filed Feb. 23, 2006, Rogers et al.
J.F. Damlencourt, et al., "High-Quality Fully Relaxed $In_{0.65}Ga_{0.35}As$ Layers Grown on InP Using the Paramorphic Approach,:" Applied Physics Letters, vol. 75, No. 23, Dec. 6, 1999, pp. 3638-3640.
Jean-Francois Damlencourt, et al., "Paramorphic Growth: A New Approach in Mismatched Heteroepitaxy to Prepare Fully Relaxed Materials," Jpn. J. Appl. Phys., vol. 3, 1999, pp. L996-L999.
P.M. Mooney, et al., "Elastic Strain Relaxation in Free-Standing SiGe/Si Structures," Applied Physics Letters, vol. 84, No. 7, Feb. 16, 2004, pp. 1093-1095.
E. Menard, et al., "A Printable Form of Silicon for High Performance Thin Film Transistors on Plastic Substrates," vol. 84, No. 26, Jun. 28, 2004, pp. 5398-5400.
G.M. Cohen, et al., "Free Standing Silicon as a Compliant Substrate for SiGe," CMOS Front-End Materials and Process Technology. Symposium (Mater. Res. Soc. Symposium Proceedings vol. 765), 2003, p. 141-146.
Patricia M. Mooney, et al. "Defect-Free Strained Si-on-Insulator Fabricated from Free-Standing Si/SiGe Structures," Abstract—2004 Materials Research Society Spring Meeting, Symposium B High-Mobility Group IV Materials and Devices.
P.M. Mooney, et al., "Strained Si-on-Insulator Fabricated from Elastically-Relaxed Si/SiGe Structures," Mat. Res. Soc. Symp. Proc.; vol. 809, 2004 Materials Research Society, pp. B1.3.1-B1.3.6.
G.M. Cohen, et al., "Free Standing Silicon as a Compliant Substrate for SiGe," Mat. Res. Soc. Symp. Proc., vol. 765, 2003 Materials Research Society, pp. D4.6.1/G1.6.1-D4.6.6/G1.6.6.
Mouloud Boudaa, et al., "Growth and Characterization of Totally Relaxed InGaAs Thick Layers on Strain-Relaxed Paramorphic InP Substrates,"Journal of Electronic Materials, vol. 33, No. 7, 2004, pp. 833-839.
Y.H. Lo, "New Approach to Grow Pseudomorphic Structures Over the Critical Thickness," Appl. Phys. Lett., vol. 59, No. 18, Oct. 28, 1991, pp. 2311-2313.
F.E. Ejeckam, et al., "Lattice Engineered Compliant Substrate for Defect-Free Heteroepitaxial Growth," Appl. Phys. Lett., vol. 70, No. 13, Mar. 31, 1997, pp. 1685-1687.
A.M. Jones, et al., Long-Wavelength InGaAs Quantum Wells Grown Without Strain-Induced Warping on InGaAs Compliant Membranes above a GaAs Substrate, Applied Physics Letters, vol. 74, No. 7, Feb. 15, 1999, pp. 1000-1002.
G.M. Cohen, et al., "Defect-Free Strained Si-on-Insulator Structures," Abstract submitted Dec. 1, 2004 for the MAR05 Meeting of the American Physical Society, available on the web in Jan. 2005.
Zhu, Z.-T., et al., "Spin on dopants for high-performance single-crystal silicon transistors on flexible plastic substrates," Applied Physics Letters, 86, 133507, Mar. 23, 2005.
Mack, S., et al., "Mechanically flexible thin-film transistors that use ultrathin ribbons of silicon derived from bulk wafers," Applied Physics Letters 88, 213101, May 22, 2006.
Ahn, Jong-Hyun, et al., "High-Speed Mechanically Flexible Single-Crystal Silicon Thin-Film Transistors on Plastic Substrates," IEEE Electron Device Letters, vol. 27, No. 6, Jun. 2006.
Masini et al., "High-Performance p-i-n Ge on Si Photodetectors for the Near Infrared: From Model to Demonstration", IEEE Transactions on Electron Devices, vol. 48, No. 6, Jun. 2001.
Rauscher, et al., "Silicon PIN Diodes: A Promising Technology for UV-Optical Space Astronomy", Presentation at NHST Workshop, Apr. 11, 2003.
Rensch, D.B. et al., "Recrystallization of Si Films on Thermal $SiO_2$—Coated Si Substrates Using a High-Speed 3-Beam Line Source," *IEEE Electron Device Letters*, vol. EDL-5, No. 2, Feb. 1984.
Yang, B. et al., "Self-organization of semiconductor nanocrystals by selective surface faceting," *Physical Review B*, vol. 72, 235413 (2005); published by The American Physical Society.
Sposili, R. S. et al., "Sequential lateral solidification of thin silicon films on $SiO_2$," *Appl. Phys. Lett.*, vol. 69, No. 19, pp. 2864-2866, Nov. 4, 1996; published by American Institute of Physics.
Beshkov, G. D. et al., "Rapid thermal recrystallization of amorphous silicon films," *J. Mater. Res.*, vol. 12, No. 10, pp. 2511-2514, Oct. 1997; published by Materials Research Society.
Kanamori, M. et al., "Raman Scattering in-depth Evaluation of Recrystallized Silicon-on-Oxide Using Different Wavelength Excitation," *Journal of Electronic Materials*, vol. 17, No. 1, pp. 33-37, Jan. 1988.
Lockwood, D., et al., "Optical Properties of Silicon Nanocrystal Superlattices," *Journal of Nanophotonics*, vol. 2, 022501, Mar. 27, 2008, 33 pages.
Dovidenko, K., et al., "Structure and Optoelectronic Properties of Si/O Superlattice," *Physica E*, vol. 16, No. 3, Mar. 2003, pp. 509-516.

\* cited by examiner

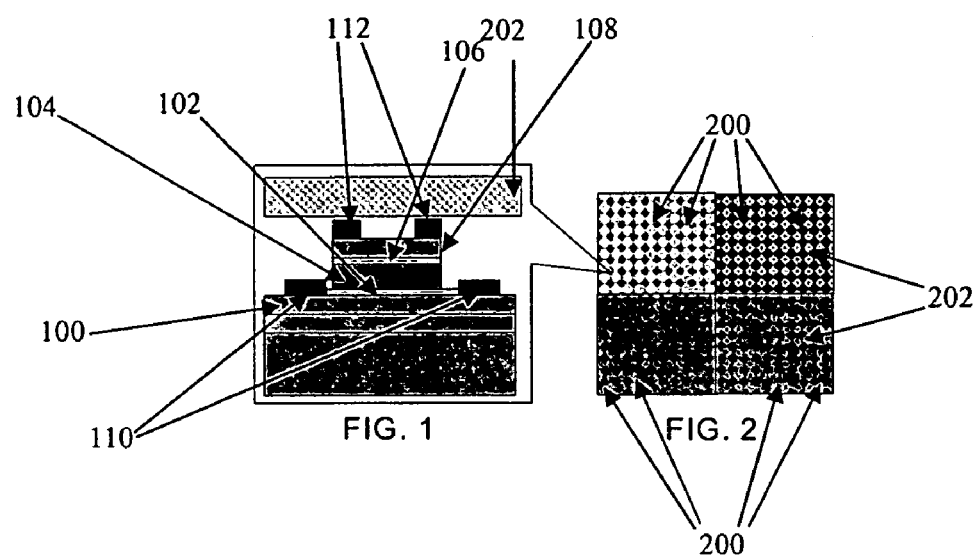
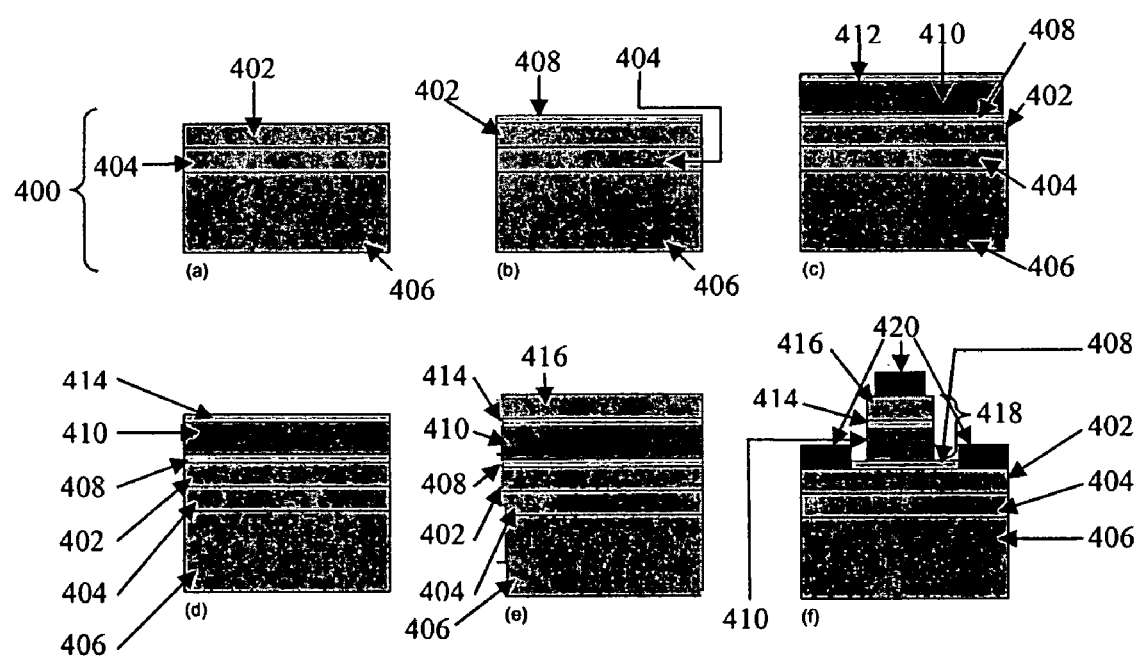
FIG. 4

US 7,777,290 B2

PIN DIODES FOR PHOTODETECTION AND HIGH-SPEED, HIGH-RESOLUTION IMAGE SENSING

STATEMENT OF GOVERNMENT RIGHTS

Research funding was provided for this invention by the National Science Foundation under Grant No. 0079983. The United States government has certain rights in this invention.

FIELD OF THE INVENTION

This invention relates to PIN diodes for use in photodetectors and CMOS optical imagers.

BACKGROUND

Multispectral photon detection (covering the visible and infrared) allows target identification with enhanced information content. For example, in military applications, multispectral-photodetector arrays can be used to identify real missile heads from fake ones and can help direct the antimissile head toward an actual target. The principle of multispectral detection has been widely used in astronomic observations. One available photodetection mechanism is electron-hole generation in a reverse-biased PIN diode For PIN diode-based photodetectors, the longest wavelength that can be detected is dictated by the bandgap of the intrinsic semiconductor used for the intrinsic layer. Photons with energy higher than the bandgap energy will be detected, as long as the intrinsic layer is sufficiently thick to absorb the photons. The photodetectors must provide high efficiency and high-speed operation in order to use them for high-speed object detection. To integrate photodetectors on a CMOS chip, where high speed and sophisticated digital signal processing circuitry can be made, Group IV-based detectors may be desirable. The current approaches of making photodetectors on a Si chip generally employ thick Si PIN diodes that are vertically buried deep in the Si substrate. For these PIN diode photodetectors, efficiency can be kept high as long as the intrinsic layer is thick enough. However, the speed of these PIN diodes is rather low, because of the long tail of collection of photon current (due to the low drift velocity of holes).

Ge is a promising material for light detection in optical communication for at least two reasons. First, because of its direct bandgap at 0.8 eV and indirect bandgap of 0.66 eV, it is highly absorbing over a wide range. Second, because of its compatibility with existing Si technology, it offers the potential for high-quality CMOS compatible integrated photoreceivers. Unfortunately, due to the large lattice mismatch between Si and Ge, progress toward the formation of Ge-based high-speed photodetectors on Si has been very limited.

Some work has been done to fabricate photodetectors using growth of Ge quantum dots on Si surfaces to make many alternating layers of Si film and Ge quantum dots. Although such photodetectors provide some increase in absorption, they show only a slight improvement over Si PIN diodes.

SUMMARY OF THE INVENTION

The present invention provides high-speed, high-efficiency PIN diodes for use as photodetector, and in CMOS imagers. The PIN diodes include a layer of intrinsic semiconducting material disposed between two tunneling barrier layers of silicon oxide. The two tunneling barrier layers are themselves disposed between a layer of n-type silicon and a layer of p-type silicon.

In a preferred embodiment, the intrinsic semiconducting material is a single-crystal germanium (Ge) nanomembrane or GeSi alloy nanomembrane and the p- and n-type silicon (Si) layers are single-crystal Si nanomembranes. The Ge or GeSi nanomembranes desirably have a thickness of no more than about 2,000 nm (the thickness depends on the tradeoff between speed and efficiency of photodetectors) and are separated by silicon oxide layers desirably having a thickness of no more than about 10 nm to provide a nanomembrane stack.

The nanomembrane stacks may be made by transferring the thin intrinsic Ge or GeSi layer onto a thin silicon layer having a very thin oxide layer on its surface. A second thin silicon layer (having a different doping type than the first) with a thin oxide layer on its surface may then be transferred onto the single-crystal Ge or GeSi layer. Alternatively, the second oxide layer may be formed on the Ge or GeSi layer by growing and oxidizing a thin layer of Si prior to the transfer of a second thin silicon layer onto the stack. In one embodiment, the Ge nanomembrane is the top device layer of a Ge-on-insulator substrate which has been released by etching away an underlying sacrificial layer (e.g., a buried oxide layer). In another embodiment, some amount of Si can be incorporated into a Ge device layer of a Ge-on-insulator substrate to form a GeSi alloy layer, which is subsequently released by etching away the underlying sacrificial layer. The released intrinsic GeSi or Ge nanomembrane may be transferred directly onto the oxidized device layer of a Si-on-insulator substrate. Alternatively, the released nanomembrane may be lifted and transferred using a host substrate.

A voltage source connected to electrodes that are electrically coupled to the n- and p-type silicon layers may be used to provide a reverse bias across the PIN diode, allowing the PIN diode to act as a photodetector. A plurality of such photodetectors may be arranged in an array to provide a photodetector array. A CMOS circuit coupled to the photodetector array may be used to provide a CMOS image sensor.

Further objects, features and advantages of the invention will be apparent from the following detailed description when taken in conjunction with the accompanying drawings.

BRIEF DESCRIPTION OF THE DRAWINGS

FIG. 1 is a cross-sectional view of a wavelength-specific photodetector in accordance with the present invention.

FIG. 2 is an illustrative layout for a multispectral photodetector array in accordance with the present invention.

FIG. 4 is a schematic diagram showing a method for making a photodetector in accordance with the present invention.

DETAILED DESCRIPTION OF THE INVENTION

Figure 3:
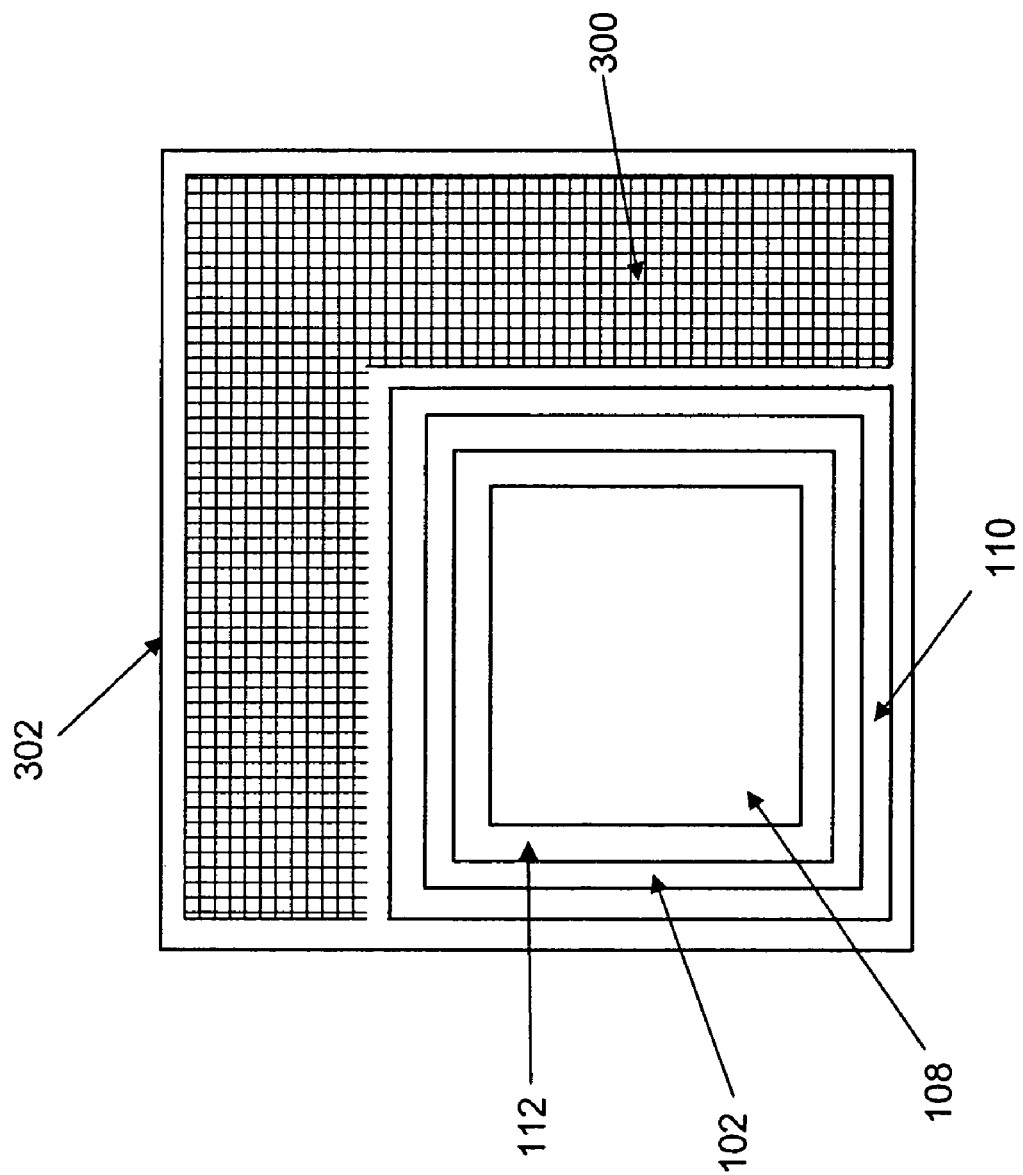
FIG. 3 is a schematic diagram showing a top view of the photodetector of FIG. 1.

The present invention provides PIN diodes with structures that improve both the speed and efficiency of photodetectors that incorporate the PIN diodes. Photodetectors made from the PIN diodes can be easily integrated with silicon processing techniques and CMOS-based devices, such as digital imagers.

As illustrated in FIG. 1, the PIN diodes include an n-type silicon layer 100; a first tunneling barrier layer 102 comprising silicon oxide disposed above the n-type silicon layer; a layer of intrinsic semiconducting material 104 disposed above the first tunneling barrier layer; a second tunneling barrier layer 106 comprising silicon oxide disposed above the layer of intrinsic semiconducting material; and a p-type silicon layer 108 disposed above the second tunneling barrier layer. In a typical embodiment, each of the aforementioned layers is disposed above and in direct contact with its preceding layer.

The PIN diodes may also include a first electrode 110 electrically coupled to the n-type silicon layer and a second electrode 112 electrically coupled to the p-type silicon layer. When a voltage source is connected to the first and second electrodes and a reverse bias is applied across the PIN diode, the PIN diode acts as a photodetector, wherein photons absorbed in the intrinsic layer generate charge carriers (i.e., electrons and holes) that are collected at their respective electrodes to generate a photocurrent. When charge carriers are created in the intrinsic layer by photons of different energies, these charge carriers will also have a range of energies. The silicon oxide tunneling barrier layers have a conduction band energy that is higher than the conduction band energy of the intrinsic semiconductor material and valance band energy that is lower than the valence band energy of the intrinsic semiconductor material. Energy barriers will be present for the charge carriers. However, the thickness of the silicon oxide on both sides is very thin. Based on quantum physics, the wave function of charge carriers with sufficient kinetic energy will overlap with the thin energy barriers. Due to the overlapping of the wave function, charge carriers can be found on the other side of the oxide energy barrier. This phenomenon is well known as tunneling. Higher-energy carriers will have higher probability across the thin energy barriers. Therefore, the tunneling barrier layers allow only those electrons and holes with sufficiently high energy to tunnel through the barrier and be collected by the electrodes. By selecting those carriers having higher energies (the tunneling barriers act like an high-energy-pass filter for charge carriers), the use of tunneling barrier layers improves the speed of the photodetectors.

While the speed of the photodetectors is improved with the introduction of the tunneling barrier layers, the photocurrent collection efficiency will inevitably be sacrificed, as only the "fast" electrons and holes will be collected. For this reason, a Ge or GeSi intrinsic layer is advantageous because it increases (typically, by several orders, relative to silicon) the absorption efficiency of photons, improving the efficiency of photocurrent generation, and therefore the sensitivity of the photodetector. Ge is known to have a much higher efficiency for absorbing photons, over a wider range of wavelengths than Si. The intrinsic semiconducting material desirably comprises intrinsic Ge, desirably in the form of a thin, continuous, single-crystal nanomembrane.

In a preferred embodiment, the intrinsic layer has a thickness of no more than about 2000 nm. This includes embodiments where the intrinsic layer has a thickness of no more than about 1000 nm, further includes embodiments where the intrinsic layer has a thickness of no more than about 500 nm and still further includes embodiments where the intrinsic layer has a thickness of no more than about 200 nm. The n- and p-type silicon layers are also desirably quite thin. In some embodiments the silicon layers have a thickness of no more than about 1000 nm. This includes embodiments where the silicon layers have a thickness of no more than about 500 nm and further includes embodiments where the silicon layers have a thickness of no more than about 200 nm. The silicon oxide layers separating the n- and p-type silicon layers from the intrinsic layer typically have a thickness of no more than about 10 nm. This includes embodiments where the silicon oxide layers have a thickness of no more than about 5 nm and further includes embodiments where the silicon oxide layers have a thickness of no more than about 2 nm.

As illustrated in FIG. 2, a plurality of the photodetectors 200 may be arranged in an array to provide a photodetector array and CMOS circuitry may be coupled to the photodetector array to provide a CMOS image sensor. To achieve multispectral detection, one or more filters 202 for different wavelengths may be disposed over one or more different areas of a photodetector array. However, the use of filters is optional. These filters are widely available and can be easily implemented in the proposed photodetector arrays. The digital imaging information obtained from different areas may be processed together using CMOS digital circuitry. The CMOS circuit for image processing may be fabricated on a substrate (e.g., a silicon substrate) underlying the PIN diodes or on the n- and p-type Si layers. Photodetector arrays composed of PIN diodes and CMOS circuits for use with photodetector arrays are known. Descriptions of appropriate layouts for arrays of PIN diodes and CMOS circuits for use with arrays of PIN diodes are described in U.S. Pat. Nos. 6,809,358 and 6,831,263; the entire disclosures of which are incorporated herein by reference.

FIG. 3 shows a top view of a single pixel in a CMOS image sensor that includes the PIN diode of FIG. 1 and CMOS circuitry 300. In the embodiment of FIG. 3, a layer of insulation 302 is disposed around the pin diode and the perimeter of the pixel.

FIG. 4 shows an example of a fabrication process flow that may be used to make high-speed and high-efficiency CMOS compatible photodetectors in accordance with the present invention. In this illustrative process, Si and Ge nanomembranes are employed. The base substrate upon which the PIN diode is fabricated is a Si-on-insulator substrate 400 that includes a thin, n-type silicon layer 402 over a buried oxide layer 404 that is supported on a silicon handle layer 406. (See step (a).) Silicon layer 402 has a thin oxide layer 408 on its surface. (See step (b).) Oxide layer 408 may be a native oxide layer or may be generated by a separate oxidation process. Silicon layer 402 does not have to be the template layer of a silicon-on-insulator wafer, as in FIG. 4. Instead, silicon layer 402 and its oxide layer 408 may be pre-fabricated and transferred from a separate substrate. A single-crystal intrinsic Ge layer 410, which has been released from a Ge-on-insulator substrate by removing a sacrificial layer under the Ge layer, is transferred and bonded to silicon oxide layer 408. Ge layer 410 may be transferred with a pre-grown Si layer 412 which is subsequently oxidized to provide a silicon oxide layer 414. (See steps (c) and (d).) A p-type silicon layer 416 is then transferred and bonded to silicon oxide layer 414. (See step (e).) A mesa 418 is then etched into layers 410, 414 and 416 and electrodes 420 are deposited on n-type silicon layer 402 and p-type silicon layer 416. (See step (f).) As shown in FIGS. 1 and 3, the electrode on the p-type silicon layer may define a central opening for the light to go through. The electrode formation may be done after surface passivation using PECVD oxide or grown oxide or nitride. Via holes for metal contacts may be desirable if passivation is used. The positions of p-type and n-type silicon can be exchanged.

In some embodiments, as shown, for example, in FIGS. 1 and 4, the PIN diodes are fabricated on a solid semiconductor-on-insulator support. However, in other embodiments, the nanomembrane stack can be transferred to a flexible substrate (e.g., a plastic film), to provide flexible photodetectors and imagers and to allow light coupled from the backside of the PIN diodes. If a spherically formed flexible substrate is used, an artificial eye or similar device can be made.

The nanomembrane transfer process of steps (c) and (e) in FIG. 4 may be carried out as follows. The intrinsic layer may be fabricated from a device substrate that includes a thin layer of single-crystal Ge or GeSi supported on a sacrificial layer (e.g., a buried oxide layer). The intrinsic layer is then released from the sacrificial layer by removing (e.g., etching) the sacrificial layer, lifting the released layer and transferring the released layer. Lifting the released layer may be carried out by contacting the released layer with a host substrate or a tape which can be vaporized upon low-temperature heating after finishing transfer, to which the upper surface of the released layer adheres. In some embodiments, the host substrate itself forms part of the PIN diode. For example, the host substrate may be an n- or p-doped silicon layer with a native oxide on its surface. In other embodiments, the host substrate provides a temporary support on which the released layer is transported before being transferred to an n- or p-doped silicon layer with a native oxide on its surface. A similar process may be used to form and transfer a released n- or p-type silicon layer. The host substrate is generally characterized by at least one surface to which the released layer adheres. Generally, the host substrate will be coated with an adhesive coating to promote adhesion of the released layer.

For the purposes of this disclosure and unless otherwise specified, "a" or "an" means "one or more". All patents, applications, references and publications cited herein are incorporated by reference in their entirety to the same extent as if they were individually incorporated by reference.

While the principles of this invention have been described in connection with specific embodiments, it should be understood clearly that these descriptions are made only by way of example and are not intended to limit the scope of the invention.

What is claimed is:

1. A PIN diode comprising:
   (a) a layer of n-type silicon;
   (b) a first tunneling barrier layer of silicon dioxide disposed over the layer of n-type silicon;
   (c) no more than a single layer of single-crystal intrinsic semiconducting material disposed over the first tunneling barrier layer;
   (d) a second tunneling barrier layer of silicon dioxide disposed over the layer of single-crystal intrinsic semiconducting material; and
   (e) a layer of p-type silicon disposed over the second tunneling barrier layer,
   wherein the first and second tunneling barrier layers are each continuous silicon dioxide layers.

2. The PIN diode of claim 1, further comprising a first electrode electrically coupled to the layer of n-type silicon and a second electrode electrically coupled to the layer of p-type silicon.

3. The PIN diode of claim 2, wherein a voltage source is connected to the first and second electrodes to provide a photodetector.

4. The PIN diode of claim 1, wherein the layer of single-crystal intrinsic semiconducting material has a thickness of no more than about 2000 nm.

5. The PIN diode of claim 1, wherein the layer of single-crystal intrinsic semiconducting material has a thickness of no more than about 200 nm.

6. The PIN diode of claim 1, wherein the layer of single-crystal intrinsic semiconducting material is a single-crystal layer of intrinsic germanium.

7. The PIN diode of claim 6, wherein the layer of single-crystal intrinsic germanium has a thickness of no more than about 1000 nm.

8. The PIN diode of claim 6, wherein the layer of single-crystal intrinsic germanium has a thickness of no more than about 500 nm.

9. The PIN diode of claim 6, wherein the layer of n-type silicon and the layer of p-type silicon are single-crystal layers with thicknesses of no more than about 1000 nm.

10. The PIN diode of claim 6, wherein the layer of n-type silicon and the layer of p-type silicon are single-crystal layers with thicknesses of no more than about 500 nm.

11. The PIN diode of claim 7, wherein the first and second tunneling barrier layers have a thickness of no more than about 10 nm.

12. The PIN diode of claim 1, wherein the layer of single-crystal intrinsic semiconducting material is a layer of single-crystal intrinsic germanium-silicon alloy.

13. The PIN diode of claim 12, wherein the layer of single-crystal intrinsic germanium-silicon alloy has a thickness of no more than about 2000 nm.

14. The PIN diode of claim 12, wherein the layer of n-type silicon and the layer of p-type silicon are single-crystal layers with thicknesses of no more than about 1000 nm.

15. The PIN diode of claim 14, wherein the first and second tunneling barrier layers have a thickness of no more than about 10 nm.

16. A photodetector array comprising a plurality of PIN diodes according to claim 3, arranged in an array.

17. The photodetector array of claim 16, further comprising at least one optical filter disposed over one or more of the plurality of PIN diodes.

18. An image sensor comprising the photodetector array of claim 16 and further comprising a CMOS circuit coupled to the photodetector array.

19. A PIN diode comprising:
   (a) a layer of n-type silicon having a thickness of no more than about 1000 nm;
   (b) a first tunneling barrier layer of silicon dioxide disposed over the layer of n-type silicon;
   (c) no more than a single layer of single-crystal intrinsic germanium having a thickness of no more than about 2000 nm disposed over the first tunneling barrier layer;
   (d) a second tunneling barrier layer of silicon dioxide disposed over the layer of single-crystal intrinsic germanium; and
   (e) a layer of p-type silicon having a thickness of no more than about 1000 nm disposed over the second tunneling barrier layer,
   wherein the first and second tunneling barrier layers are each continuous silicon dioxide layers.

20. The PIN diode of claim 19, wherein the layers of n-type and p-type silicon have thicknesses of no more than about 500 nm and the layer of single-crystal intrinsic germanium has a thickness of no more than about 200 nm.

21. The PIN diode of claim 19, wherein a first electrode is electrically coupled to the layer of n-type silicon and a second electrode is electrically coupled to the layer of p-type silicon and a voltage source is connected to the first and second electrodes to provide a photodetector.

22. A photodetector array comprising a plurality of PIN diodes according to claim 21, arranged in an array.

23. The photodetector array of claim 22, further comprising at least one optical filter disposed over one or more of the plurality of PIN diodes.

24. An image sensor comprising the photodetector array of claim 22 and further comprising a CMOS circuit coupled to the photodetector array.

25. A PIN diode comprising:
   (a) a layer of n-type silicon having a thickness of no more than about 1000 nm;
   (b) a first tunneling barrier layer of silicon dioxide disposed over the layer of n-type silicon;

(c) no more than a single layer of single-crystal intrinsic germanium-silicon alloy having a thickness of no more than about 2000 nm disposed over the first-tunneling barrier layer;
(d) a second tunneling barrier layer of silicon dioxide disposed over the layer of single-crystal intrinsic germanium-silicon alloy; and
(e) a layer of p-type silicon having a thickness of no more than about 1000 nm disposed over the second tunneling barrier layer,
wherein the first and second tunneling barrier layers are each continuous silicon dioxide layers.

26. The PIN diode of claim 25, wherein the layers of n-type and p-type silicon have thicknesses of no more than about 500 nm and the layer of single-crystal intrinsic germanium-silicon alloy has a thickness of no more than about 200 nm.

27. The PIN diode of claim 25, wherein a first electrode is electrically coupled to the layer of n-type silicon and a second electrode is electrically coupled to the layer of p-type silicon and a voltage source is connected to the first and second electrodes to provide a photodetector.

28. A photodetector array comprising a plurality of PIN diodes according to claim 27, arranged in an array.

29. The photodetector array of claim 28, further comprising at least one optical filter disposed over one or more of the plurality of PIN diodes.

30. An image sensor comprising the photodetector array of claim 28 and further comprising a CMOS circuit coupled to the photodetector array.

31. A PIN diode comprising:
(a) a layer of n-type silicon;
(b) a first tunneling barrier layer of silicon dioxide disposed over the layer of n-type silicon;
(c) a layer of single-crystal intrinsic semiconducting material disposed over the first tunneling barrier layer;
(d) a second tunneling barrier layer of silicon dioxide disposed over the layer of single-crystal intrinsic semiconducting material; and
(e) a layer of p-type silicon disposed over the second tunneling barrier layer, wherein the layer of single-crystal intrinsic semiconducting material substantially spans the length of the layer of p-type silicon, further wherein the layer of single-crystal intrinsic semiconducting material is in direct contact with the first tunneling barrier layer, the second tunneling barrier layer, or both, and further wherein the first and second tunneling barrier layers are each continuous silicon dioxide layers.

32. The PIN diode of claim 31, wherein the layer of n-type silicon and the layer of p-type silicon each have a thickness of no more than about 1000 nm, and further wherein the single layer of single-crystal intrinsic semiconducting material is a single layer of single-crystal intrinsic germanium having a thickness of no more than about 2000 nm.

33. The PIN diode of claim 31, wherein the layer of n-type silicon and the layer of p-type silicon each have a thickness of no more than about 1000 nm, and further wherein the single layer of single-crystal intrinsic semiconducting material is a single layer of single-crystal intrinsic germanium-silicon alloy having a thickness of no more than about 2000 nm.

34. A PIN diode comprising:
(a) a layer of n-type silicon;
(b) a first tunneling barrier layer of silicon dioxide disposed over the layer of n-type silicon;
(c) a layer of single-crystal intrinsic semiconducting material disposed over the first tunneling barrier layer;
(d) a second tunneling barrier layer of silicon dioxide disposed over the layer of single-crystal intrinsic semiconducting material; and
(e) a layer of p-type silicon disposed over the second tunneling barrier layer; wherein the layer of single-crystal intrinsic semiconducting material runs along an axis running parallel to and between the first tunneling barrier layer and the second tunneling barrier layer, further wherein there is no more than a single layer of the single-crystal intrinsic semiconducting material running along the axis between the first tunneling barrier layer and the second tunneling barrier layer, and further wherein the first and second tunneling barrier layers are each continuous silicon dioxide layers.

35. The PIN diode of claim 34, wherein the layer of single-crystal intrinsic semiconducting material is in direct contact with the first tunneling barrier layer, the second tunneling barrier layer, or both.

36. The PIN diode of claim 1, wherein the layer of single-crystal intrinsic semiconducting material is in direct contact with the first tunneling barrier layer, the second tunneling barrier layer, or both.

37. The PIN diode of claim 19, wherein the layer of single-crystal intrinsic germanium is in direct contact with the first tunneling barrier layer, the second tunneling barrier layer, or both.

38. The PIN diode of claim 25, wherein the layer of single-crystal intrinsic germanium-silicon alloy is in direct contact with the first tunneling barrier layer, the second tunneling barrier layer, or both.

* * * * *